United States Patent
Achuthan et al.

(10) Patent No.: US 6,855,607 B2
(45) Date of Patent: Feb. 15, 2005

(54) MULTI-STEP CHEMICAL MECHANICAL POLISHING OF A GATE AREA IN A FINFET

(75) Inventors: Krishnashree Achuthan, San Ramon, CA (US); Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/459,495

(22) Filed: Jun. 12, 2003

(65) Prior Publication Data

US 2004/0253775 A1 Dec. 16, 2004

(51) Int. Cl.$^7$ .............................................. H01L 21/336
(52) U.S. Cl. ......................... 438/283; 438/633; 438/959
(58) Field of Search ................................ 438/279, 283, 438/633, 692, 959

(56) References Cited

U.S. PATENT DOCUMENTS 6,162,368 A * 12/2000 Li et al. ...................... 438/692
6,350,693 B2 * 2/2002 Chang et al. ............... 438/959
6,431,959 B1 * 8/2002 Mikhaylich et al. .......... 451/41

OTHER PUBLICATIONS

Digh Hisamoto et al.: "FinFET—A Self–Aligned Double–Gate MOSFET Scalable to 20 nm," IEEE Transactions on Electron Devices, vol. 47, No. 12, Dec. 2000, pp. 2320–2325.
Yang–Kyu Choi et al.: "Sub–20nm CMOS Fin FET Technologies," 0–7803–5410–9/99 IEEE, Mar. 2001, 4 pages.
Xuejue Huang et al.: "Sub–50 nm P–Channel Fin FET," IEEE Transactions on Electron Devices, vol. 48, No. 5, May 2001, pp. 880–886.
Yang–Kyu Choi et al.: "Nanoscale CMOS Spacer FinFET for the Terabit Era," IEEE Electron Device Letters, vol. 23, No. 1, Jan. 2002, pp. 25–27.
Xuejue Huang et al.: "Sub 50–nm FinFET: PMOS," 0–7803–7050–3/01 IEEE, Sep. 1999 4 pages.

* cited by examiner

Primary Examiner—Chandra Chaudhari
(74) Attorney, Agent, or Firm—Harrity & Snyder LLP (57) ABSTRACT

A method of manufacturing a MOSFET type semiconductor device includes planarizing a gate material layer that is deposited over a channel. The planarization is performed in a multi-step process that includes an initial "rough" planarization and then a "fine" planarization. The slurry used for the finer planarization may include added material that tends to adhere to low areas of the gate material.

17 Claims, 9 Drawing Sheets

MULTI-STEP CHEMICAL MECHANICAL POLISHING OF A GATE AREA IN A FINFET

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the present invention provide a double-gate MOSFET having a finely controlled gate area.

One aspect of the invention is directed to a method of manufacturing a semiconductor device. The method includes forming a fin structure on an insulator and forming a gate structure over at least a portion of the fin structure and a portion of the insulator. The method further includes planarizing the gate structure by performing a chemical mechanical polishing (CMP) of the gate structure using a first slurry and planarizing the gate structure by performing a CMP of the gate structure using a second slurry different than the first slurry. The second planarizing of the gate structure reduces a height of the gate structure above the fin structure while raising a height of the gate structure surrounding the fin structure.

Another aspect of the invention is directed to a method for forming a MOSFET. The method includes forming a source, a drain, and a fin structure on an insulating layer. Portions of the fin structure act as a channel for the MOSFET. The method further includes forming a dielectric layer on side surfaces of the fin structure and depositing a polysilicon layer around the dielectric layer. The polysilicon layer acts as a gate area for the MOSFET. Still further, the method includes planarizing the polysilicon layer at a first rate and further planarizing the polysilicon layer at a second rate slower than the first rate.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A FinFET, as the term is used herein, refers to a type of MOSFET in which a conducting channel is formed in a vertical Si "fin." FinFETs are generally known in the art.

Figure 1:
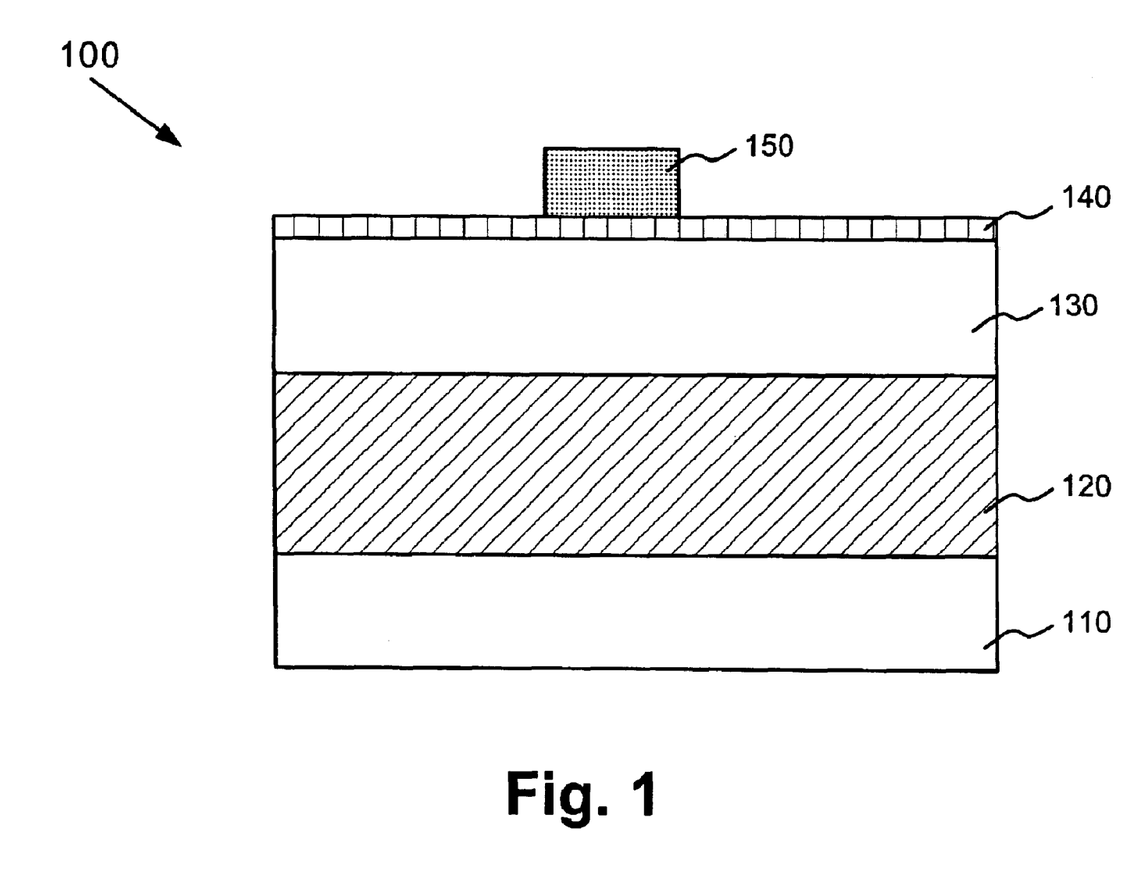
FIG. 1 is a diagram illustrating the cross-section of a semiconductor device.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon. Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be grown to a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions. In other implementations, silicon layer 130 may be patterned and etched to form source and drain regions simultaneously with the fin.

Figure 2A:
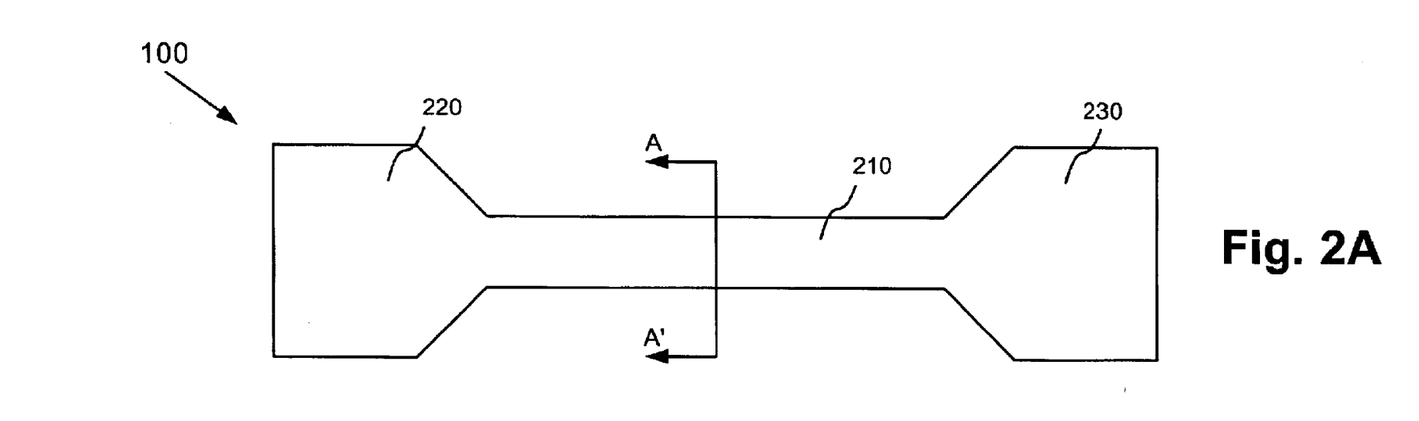
FIG. 2A is a diagram illustrating the top view of a fin structure formed on the semiconductor device shown in FIG. 1.

FIG. 2A schematically illustrates the top view of a fin structure on semiconductor device 100 formed in such a manner. Source region 220 and drain region 230 may be formed adjacent the ends of fin 210 on buried oxide layer 120, according to an exemplary embodiment of the present invention.

Figure 2B:
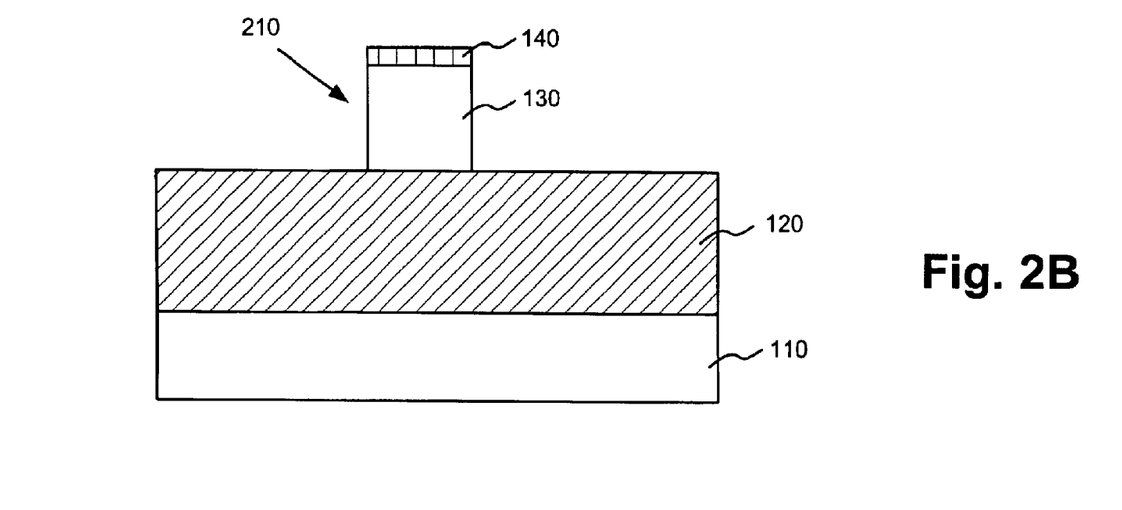
FIG. 2B is a diagram illustrating a cross-section along line A-A' in FIG. 2A.

FIG. 2B is a cross-section along line A-A' in FIG. 2A illustrating the formation of fin structure 210. As described above, dielectric layer 140 and silicon layer 130 may be etched to form fin 210 with a dielectric cap 140.

Figure 3:
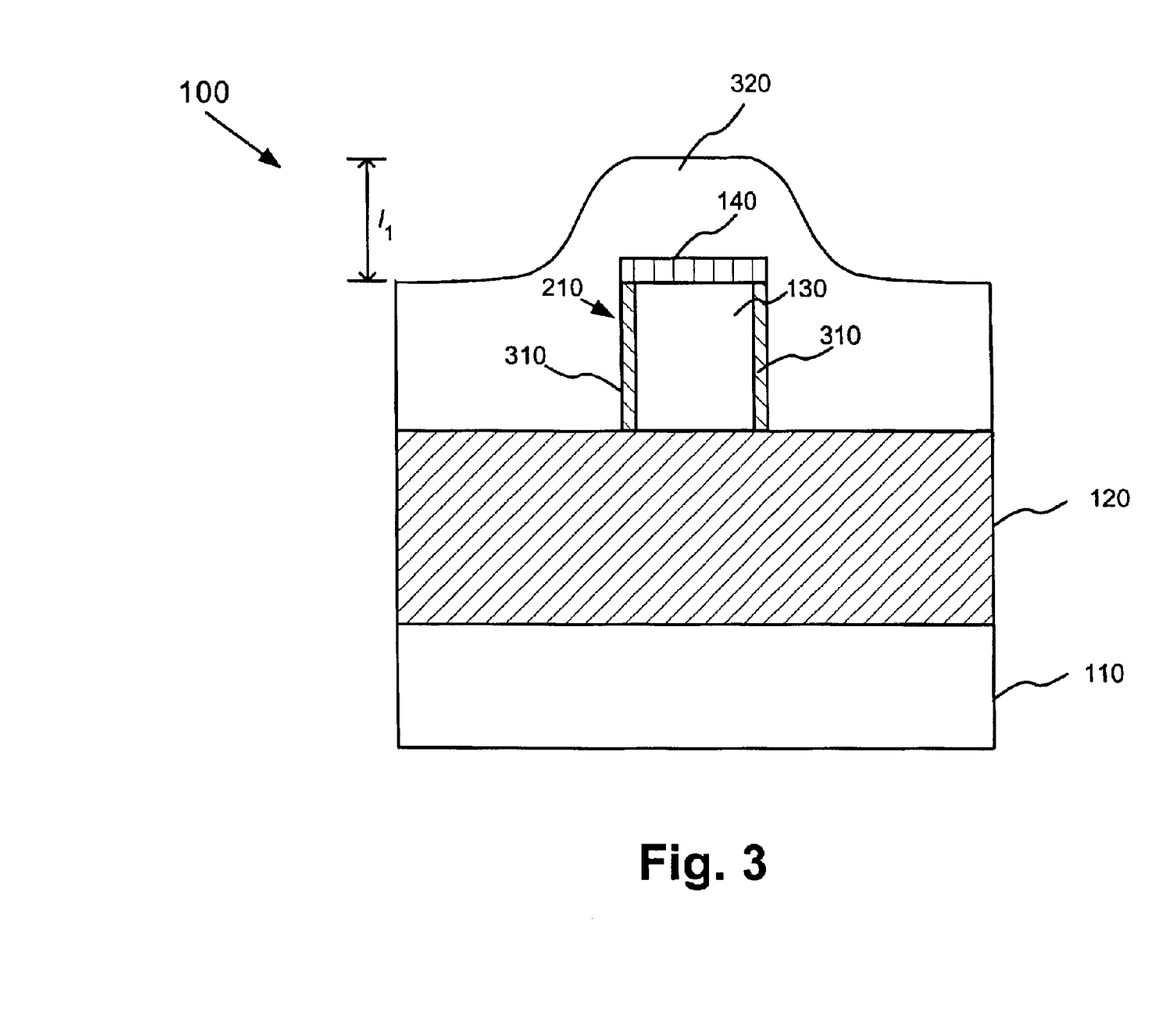
FIG. 3 is a diagram illustrating a cross-section of a gate dielectric layer and gate material over the fin shown in FIG. 2B.

FIG. 3 is a cross-section illustrating the formation of a gate dielectric layer and gate material over fin 210 in accordance with an exemplary embodiment of the present invention. A dielectric layer may be formed on fin 210. For example, a thin sacrificial oxide film 310 may be thermally grown on fin 210, as illustrated in FIG. 3. The oxide film 310 may be grown to a thickness of about 50 Å to about 100 Å and may be formed on the exposed side surfaces of fin 210.

A gate material layer 320 may be deposited over semiconductor device 100 after formation of the oxide film 310. In an exemplary implementation, the gate material layer 320 may include polysilicon deposited using conventional chemical vapor deposition (CVD) or other well known techniques. Gate material 320 may be deposited to a thickness ranging from about 500 Å to 2800 Å. Alternatively, other semiconducting materials, such as germanium or combinations of silicon and germanium, or various metals may be used as the gate material. Gate material layer 320 forms the conductive gate of FinFET 100.

Gate material 320, as illustrated in FIG. 3, extends vertically in the area above fin 210. In an exemplary embodiment, gate material layer 320 extends a distance $l_1$, which may range from approximately 500 Å to 1500 Å.

Gate material 320 may be planarized. Consistent with an aspect of the invention, gate material 320 may be planarized in a multi-step planarization process.

Chemical mechanical polishing (CMP) is one know planarization technique that is generally used to planarize a semiconductor surface. In CMP processing, a wafer is placed face down on a rotating platen. The wafer, held in place by a carrier, rotates in the same direction of the platen. On the surface of the platen is a polishing pad on which there is a polishing slurry. The slurry may include a colloidal solution of silica particles in a carrier solution. The chemical composition and pH of the slurry affects the performance of the CMP process.

Figure 4A:
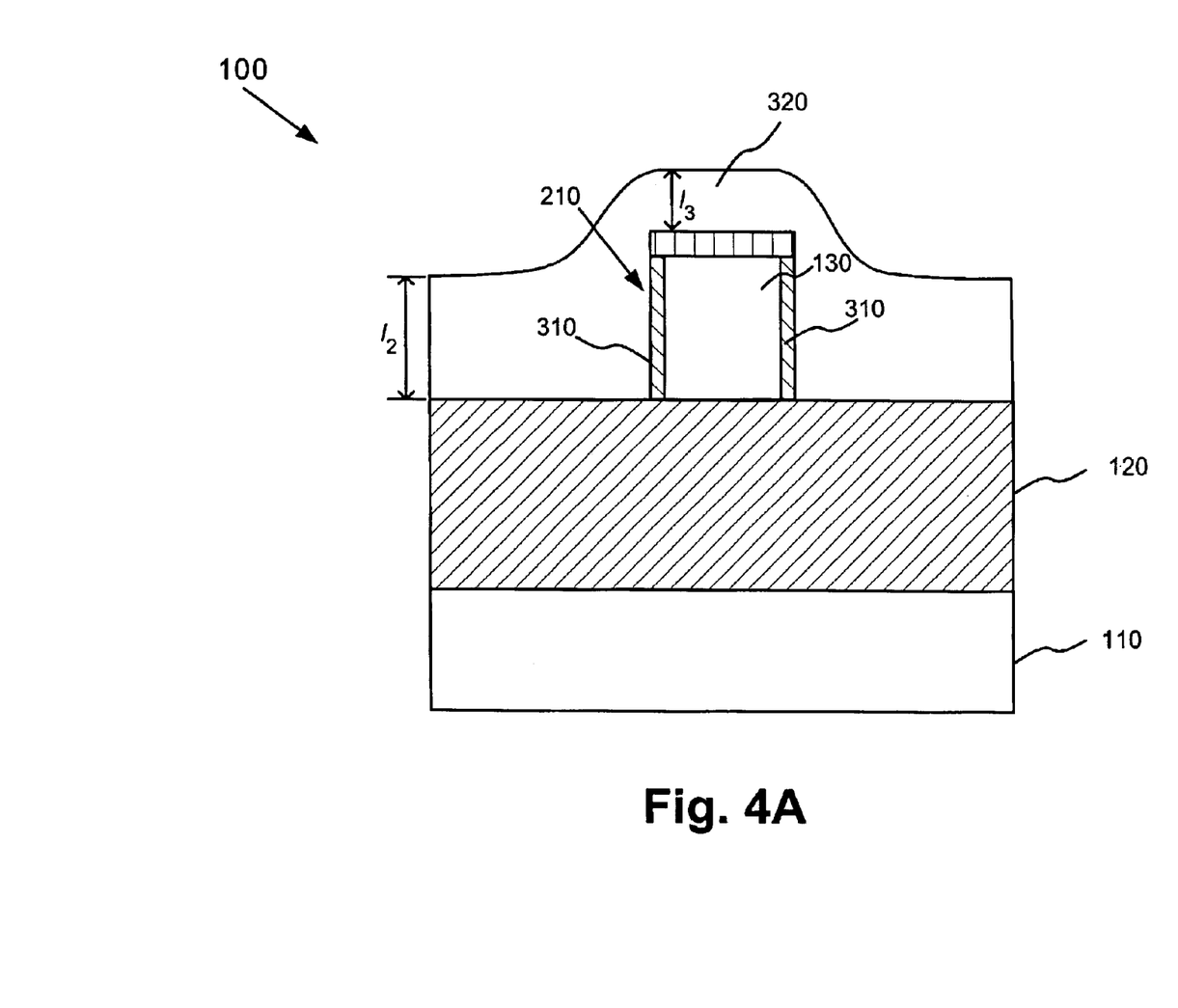
FIG. 4A is a cross-section illustrating planarizing of the gate material in accordance with an exemplary planarization process consistent with the present invention.

FIG. 4A is a cross-section illustrating the planarizing of the gate material 320 in accordance with a first step of an exemplary planarization process consistent with the present invention. In this step, a "rough" planarization may be performed. In other words, a process having a relatively high rate of removal of gate material 320 may be used to quickly polish a portion of gate material 320. In an exemplary embodiment, a portion of gate material 320 may be reduced during the rough planarization, as illustrated in FIG. 4A. For example, an amount of gate material 320 may be removed such that distance $l_2$ ranges from about 0 Å to 1500 Å. Distance $l_3$ may range from about 0 Å to 500 Å. This rough planarization step may reduce the height of the gate material both in the portion above fin 210 and the surrounding areas of gate material 320.

The poly slurry used in the planarization shown in FIG. 4A may have a pH ranging from about 10.5–11.5. The slurry may be a silica based buffered slurry that has an extra alkali component added to it such as TMAH, Ammonium hydroxide or potassium hydroxide at concentrations ranging from about 0.1%–4%.

Figure 4B:
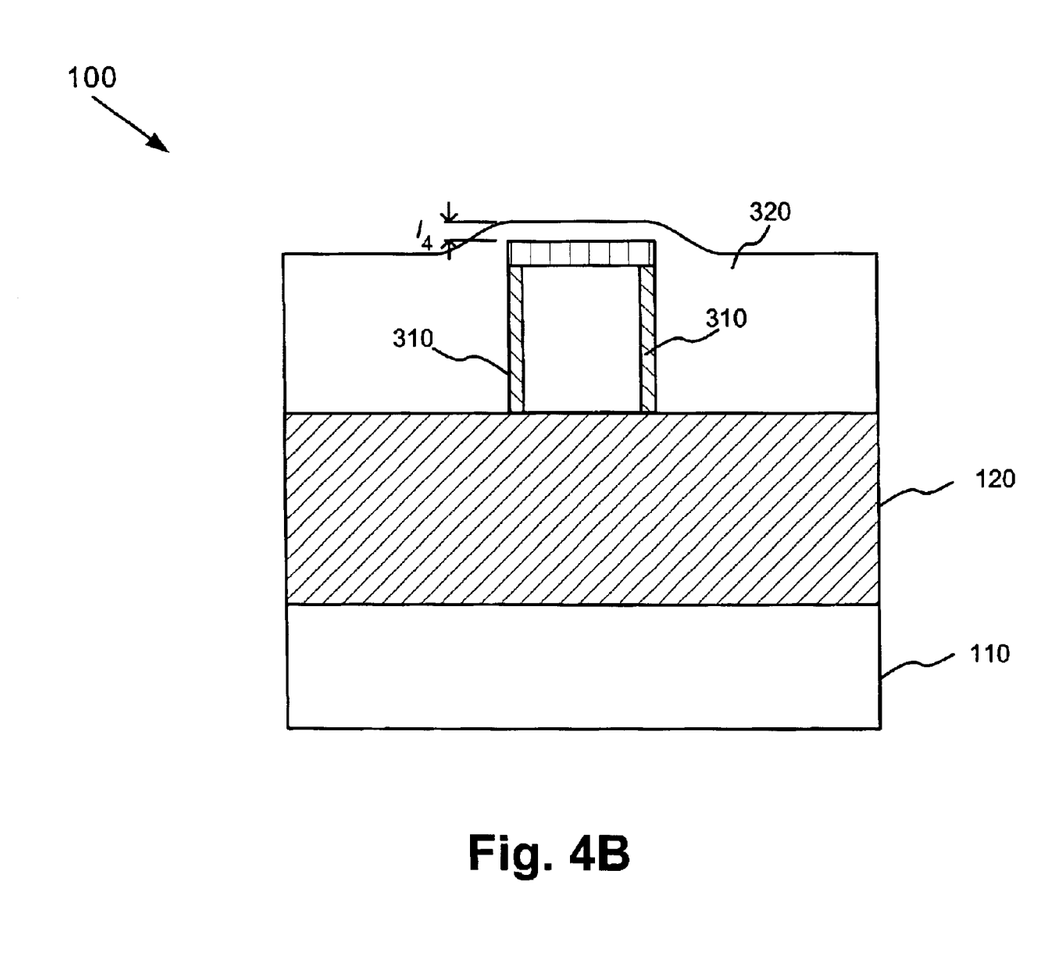
FIG. 4B is a cross-section illustrating further planarizing of the gate material in accordance with an exemplary planarization process consistent with the present invention.

FIG. 4B is a cross-section illustrating the planarizing of the gate material 320 in accordance with a second step of an exemplary planarization process of the present invention. In this step, a finer planarization may be performed. In other words, a process with a reduced planarization rate relative to the first polishing step is performed. For example, a process that removes approximately 200 Å/minute of gate material layer 320 may be used. This process may be performed to polish gate material 320 until approximately 300 Å of gate material 320 remains over fin 210, as illustrated in FIG. 4B. This distance is illustrated as $l_4$ in FIG. 4B.

In the second planarization process, the slurry may be selected so that in addition to achieving a slower polishing rate, the slurry adheres to the low areas of gate material 320. For example, the slurry may include large molecular weight compounds with hydrophobic molecular groups that will tend to adhere to the polysilicon in gate material layer 320. This planarization process will tend to raise the low areas of gate material layer 320, thereby achieving an improved planarization of gate material layer 320. The resulting gate material layer 320 is relatively planar and has relatively good surface uniformity.

The slurry used in the second planarization may have a pH ranging from about 10.5–11.5. The slurry may be a silica based buffered slurry has an extra alkali component to it such as TMAH, Ammonium hydroxide or potassium hydroxide at concentrations ranging from about 0.1%–1%.

The multiple planarizing steps discussed above allow for a highly controllable CMP process that can retain as little as 300 Å of gate material layer 320 over fin 210. The first step is a relatively high rate process that planarizes a first portion of gate material layer 320 and the second step reduces the removal rate to achieve the desired amount of gate material layer 320 above fin 210. Although a two step CMP process is particularly described herein, one of ordinary skill in the art will appreciate that more than two steps could also be used.

Figure 5:
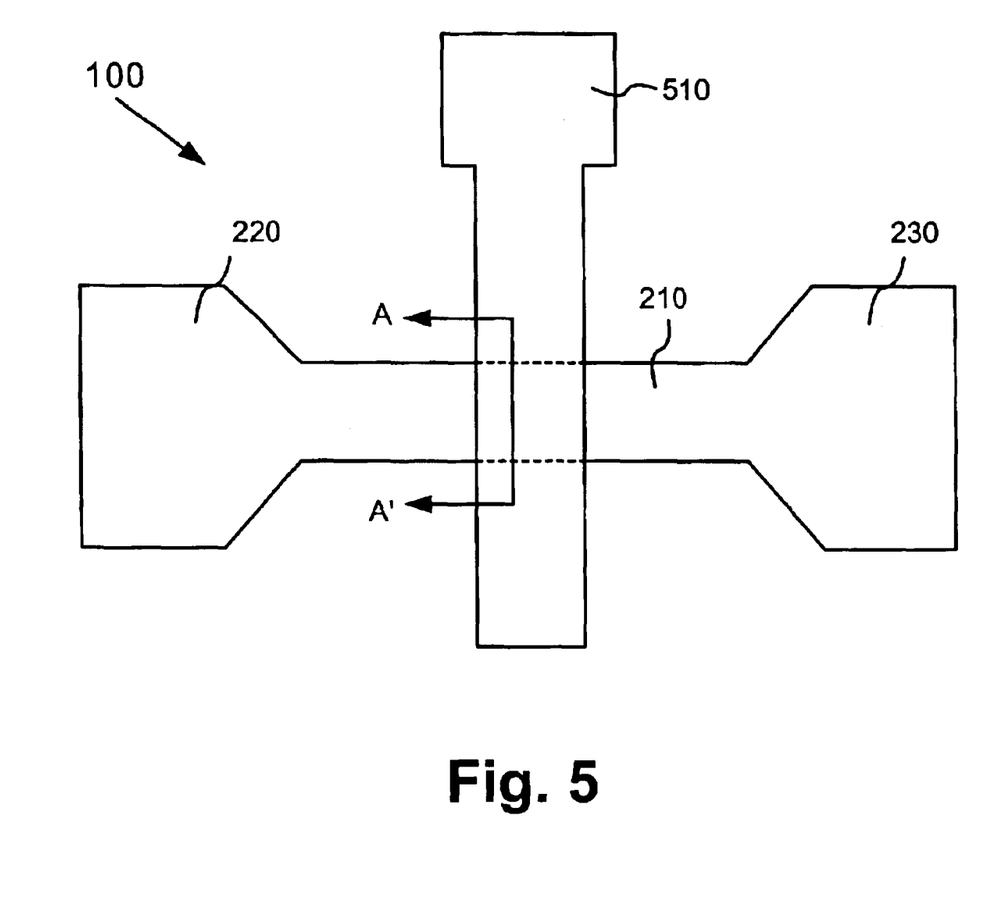
FIG. 5 is a diagram schematically illustrating a top view of a FinFET showing a gate structure patterned from the gate material shown in FIG. 3.

FIG. 5 schematically illustrates the top view of semiconductor device 100 illustrating a gate structure 510 patterned from gate material layer 320. Gate structure 510 may be patterned and etched after the CMP process is completed. Gate structure 510 extends across a channel region of the fin 210. Gate structure 510 may include a gate portion proximate to the sides of the fin 210 and a larger electrode portion spaced apart from the fin 210. The electrode portion of gate structure 510 may provide an accessible electrical contact for biasing or otherwise controlling the gate portion.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

OTHER IMPLEMENTATIONS

As previously discussed, in a CMP processes, a polishing pad may be attached to the surface of the platen to agitate the polishing slurry. The polishing pads may have a texture that affects the planarization process. Conventionally, polishing pads are classified as "hard" pads, called type A pads, and "soft" pads, called type B pads. The type A pads are particularly useful for fast planarization and the type B pads are generally used more to provide uniform planarization.

Figure 6A:
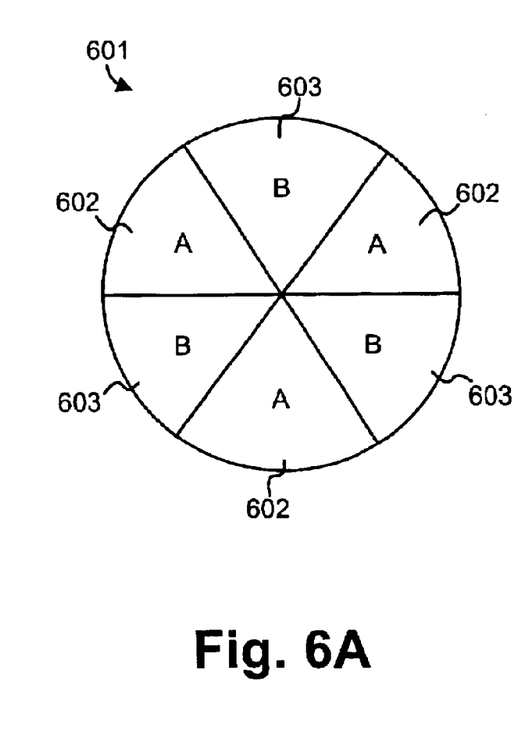
FIGS. 6A and 6B are diagrams illustrating polishing pads.

To achieve high planarization and uniformity from a single pad, a pad can be created that includes both type A and type B features. FIG. 6A is a diagram of one such pad. As shown, pad 601 includes multiple slices (e.g., six slices are shown in FIG. 6A) that alternate between being type A slices 602 and type B slices 603. The single pad 601 may be used to simultaneously provide effective planarization and uniformity.

Pad 601 is made up of 50% type A material 602 and 50% type B material 603. By varying the proportions of type A material 602 and type B material 603, polishing pads can be created that provide different degrees of planarization and uniformity. For example, if four of the slices in pad 601 were type A and two were type B, the pad would be biased toward 67% planarization and 33% uniformity.

Figure 6B:
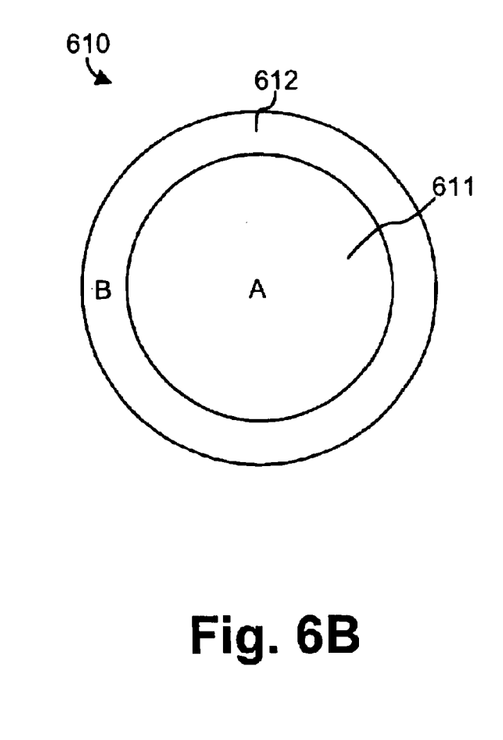

FIG. 6B is a diagram of polishing pad design in another implementation. Pad 610 includes an inner area 611 of a first pad type (e.g., type A) and an outer ring 612 of a second pad type (e.g., type B). Pad 610 provides high planarization with edge uniformity control. This effect can be difficult to achieve using conventional separate pads.

As previously discussed with reference to FIGS. 3, 4A, and 4B, gate material layer 320, when deposited over fin 210, develops protrusions centered over fin 210. The multi-step CMP planarization process described above planarizes the gate material layer 320 to form a more uniform surface for gate material layer 320. In some implementations, dummy fin structures may additionally be placed next to fin 210 to help the planarization process yield a more uniform gate material layer 320.

Figure 7:
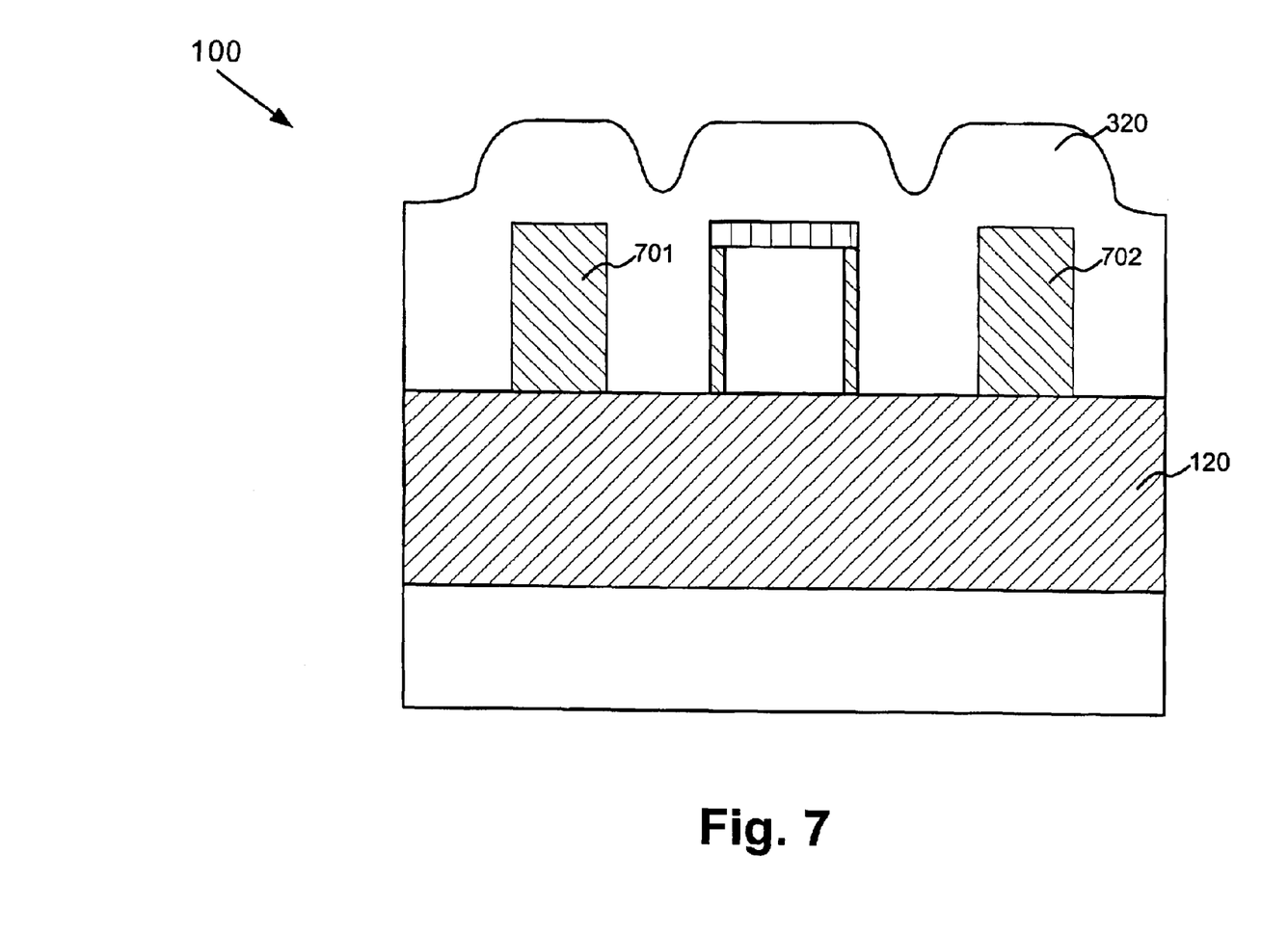
FIG. 7 is a cross-section illustrating a FinFET having dummy fins.

FIG. 7 is a cross-sectional diagram illustrating dummy fins. FIG. 7 is generally similar to the cross-section shown in FIG. 3, except in FIG. 7, dummy fins 701 and 702 have been formed next to the actual fin 210. Dummy fins 701 and 702 do not play a role in the final operation of the FinFET. However, by placing fins 701 and 702 in proximity to fin 210, gate material layer 320 may form a more uniform distribution when it is initially deposited. That is, dummy fins 701 and 702 cause the low point in gate material layer 320 to be higher in the areas adjacent to fin 210 than if dummy fins 701 and 702 were not present. Thus, in the implementation shown in FIG. 7, gate material 320 starts off more uniform than without dummy fins 701 and 702. This can lead to better uniformity after planarization.

Dummy fins 701 and 702 can be formed in a number of different shapes at multiple locations on buried oxide layer 120. For example, dummy fins 701 and 702 may be shaped in the pattern of a square, an oblong shape, a donut shape, or another shape, such as a more angular shape. In some FinFET implementations, an oxide-based layer (e.g., tetraethylorthosilicate, "TEOS" layer) may be applied above a polysilicon gate layer. Dummy fins 701 and 702 may be useful in these implementations also.

Figure 8A:
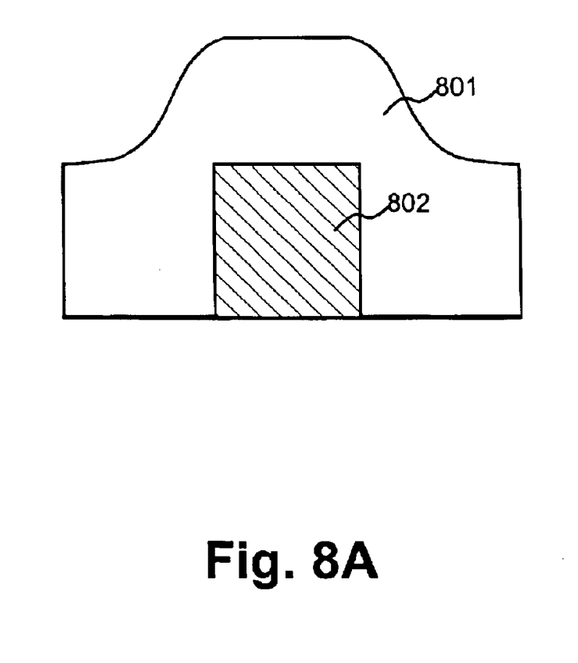
FIGS. 8A and 8B are cross-sections illustrating planarizing a TEOS layer deposited on a polysilicon layer.
Figure 8B:
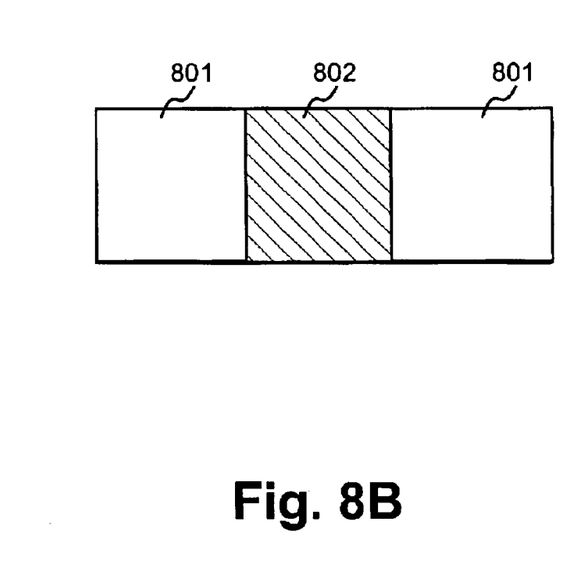

In some CMP applications, a TEOS layer is to be polished down to a poly layer. FIG. 8A illustrates a situation in which a TEOS layer 801 is deposited over a polysilicon structure 802. FIG. 8B illustrates TEOS layer 801 and polysilicon structure 802 after planarizing the TEOS layer 801 down to the level of the polysilicon structure 802. A highly selective slurry (i.e., greater than 60:1) may be used for this planarization process.

By adding surfactants and modulating the pH of the slurries, however, the selectivity of oxide to polysilicon can be modulated. In particular, pluronic, cationic, and non-ionic surfactants could be used to create more effective slurries.

CONCLUSION

A FinFET created with a multi-step CMP process is described herein. The multi-step CMP process provides for effective and highly controllable planarization of the gate polysilicon of the FinFET.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of manufacturing a semiconductor device, comprising:

forming a fin structure on an insulator;

forming a gate structure over at least a portion of the fin structure and a portion of the insulator;

planarizing the gate structure by performing a chemical mechanical polishing (CMP) of the gate structure using a first slurry; and planarizing the gate structure in a second planarization by performing a CMP of the gate structure using a second slurry different than the first slurry, the second planarization of the gate structure reducing a height of the gate structure above the fin structure in a channel region of the semiconductor device while raising a height of the gate structure surrounding the fin structure.

2. The method of claim 1, further comprising:

forming a source and a drain region adjacent the fin.

3. The method of claim 1, wherein the CMP of the gate structure using the first slurry acts to remove gate material at a faster rate than the CMP of the gate structure using the second slurry.

4. The method of claim 1, wherein, after planarizing the gate structure by performing a CMP of the gate structure using the first slurry, the gate structure extends to 500 Å to about 1500 Å over the fin structure in a channel region of the semiconductor device.

5. The method of claim 4, wherein, after planarizing the gate structure by performing a CMP of the gate structure using the second slurry, the gate structure extending to approximately 300 Å above the fin structure in the channel region of the semiconductor device.

6. The method of claim 1, wherein the semiconductor device is a FinFET.

7. The method of claim 1, wherein the first slurry is a silica based buffering slurry having a pH ranging from about 10.5–11.5 and includes an alkali component at a concentration ranging from about 0.1% to 4%.

8. The method of claim 1, wherein the second slurry is a silica based buffering slurry having a pH ranging from about 10.5–11.5 and includes an alkali component at a concentration ranging from about 0.1% to 1%.

9. The method of claim 1, wherein a removal rate of the gate structure using the second slurry is approximately 200 Å/minute.

10. A method for forming a MOSFET device comprising:

forming a source, a drain, and a fin structure on an insulating layer, portions of the fin structure acting as a channel for the MOSFET;

forming a dielectric layer around the fin structure;

depositing a polysilicon layer over the fin structure, the polysilicon layer acting as a gate area for the MOSFET;

planarizing the polysilicon layer at a first rate; and further planarizing the polysilicon layer at a second rate slower than the first rate;

wherein the further planarization of the polysilicon layer reduces a height of the polysilicon layer above the fin structure while raising a height of the polysilicon layer in areas adjacent the fin structure.

11. The method of claim 10, wherein planarizing the polysilicon layer at the first and second rates includes chemical mechanical polishing (CMP) of the polysilicon layer using first and second slurries.

12. The method of claim 10, wherein the MOSFET device is a FinFET.

13. The method of claim 10, wherein the planarizing the polysilicon layer at the first rate removes approximately 800 Å from the polysilicon layer.

14. The method of claim 10, wherein, after planarizing the polysilicon layer at the second rate, the thickness of the polysilicon layer above the fin structure is approximately 300 Å.

15. A method for forming a MOSFET device comprising:

forming a source region on an insulating layer;

forming a drain region on the insulating layer;

forming a fin structure on the insulating layer, portions of the fin structure acting as a channel for the MOSFET;

depositing a polysilicon layer over at least portions of the fin structure and the insulating layer, the polysilicon layer acting as a gate area for the MOSFET and extending over the fin structure;

performing a first planarization of the polysilicon layer at a first rate; and performing a second planarization of the polysilicon layer at a second rate slower than the first rate, the second planarization of the polysilicon layer reducing a height of the polysilicon layer over the fin structure while raising a height of the polysilicon layer adjacent the fin structure; and doping the source and drain regions.

16. The method of claim 15, wherein polishing the polysilicon layer at the first and second rates includes chemical mechanical polishing (CMP) of the polysilicon layer using first and second slurries.

17. The method of claim 15, wherein the MOSFET device is a FinFET.

* * * * *